(12) United States Patent
Paul

(10) Patent No.: US 11,300,641 B2
(45) Date of Patent: Apr. 12, 2022

(54) PREVENTING INTERRUPTIONS IN MAGNETIC RESONANCE MEASUREMENTS

(71) Applicant: Siemens Healthcare GmbH, Erlangen (DE)

(72) Inventor: Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/075,917

(22) Filed: Oct. 21, 2020

(65) Prior Publication Data

US 2021/0123995 A1 Apr. 29, 2021

(30) Foreign Application Priority Data

Oct. 24, 2019 (DE) ...................... 10 2019 216 365.3

(51) Int. Cl.
*G01R 33/28* (2006.01)
*G01R 33/54* (2006.01)

(52) U.S. Cl.
CPC ......... *G01R 33/288* (2013.01); *G01R 33/283* (2013.01); *G01R 33/543* (2013.01)

(58) Field of Classification Search
CPC .. G01R 33/288; G01R 33/283; G01R 33/543; G01R 33/5676; G01R 33/56509; G01R 33/5673
See application file for complete search history.

(56) References Cited

U.S. PATENT DOCUMENTS

2008/0309333 A1 12/2008 Stehning
2010/0268066 A1\* 10/2010 Rehwald ............... A61B 5/055
600/419

OTHER PUBLICATIONS

German Office Action for German Application No. 10 2019 216 365.3 dated Sep. 1, 2020.

\* cited by examiner

*Primary Examiner* — Susan S Lee
(74) *Attorney, Agent, or Firm* — Lempia Summerfield Katz LLC

(57) ABSTRACT

A system and method for performing a measuring sequence by a magnetic resonance device for examining a patient is provided. The performance of the measuring sequence includes a processing of segments. If at least one determined patient load value exceeds a predetermined limit value, the processing of the measuring sequence for the time frame of exceeding the patient load value is interrupted. The determination of the at least one patient load value includes a detection of a movement of a patient into a changed pose, an adjustment of at least one following segment to the changed pose of the patient, and a determination of at least one patient load value for the adjusted at least one following segment.

18 Claims, 3 Drawing Sheets

PREVENTING INTERRUPTIONS IN MAGNETIC RESONANCE MEASUREMENTS

CROSS REFERENCE TO RELATED APPLICATIONS

This patent document also claims the benefit of DE 102019216365.3 filed on Oct. 24, 2019 which is hereby incorporated in its entirety by reference.

FIELD

Embodiments relate to a method for performing a measuring sequence by a magnetic resonance device.

BACKGROUND

In medical technology, high soft-tissue contrasts are a feature of imaging using magnetic resonance (MR), also known as magnetic resonance imaging (MRI). In this regard measuring sequences (often also referred to as pulse sequences) are carried out with the aid of a magnetic resonance device. Radio-frequency (RF) pulses are irradiated into an examination object, for example a patient. A magnetization in the tissue of the examination object is caused by the RF pulses. The precession of the magnetization triggers magnetic resonance signals that are received as measured data from the magnetic resonance device and are used to reconstruct magnetic resonance images.

A spatial encoding is impressed onto the magnetic resonance signals by switching magnetic field gradients (often also referred to as gradients or gradient pulses). The gradients are often generated by two or three gradient coils of the magnetic resonance device, each of which generates a component of the gradient in a spatial direction that is orthogonal to one another. The spatial directions may be described by an, for example orthogonal, coordinate system.

Since the recording of the measured data takes a comparatively long time for a magnetic resonance imaging, a movement of the patient often results in an inadequate image quality or image artifacts. This may result in some instances in individual or multiple recordings having to be repeated, that results in an increased expenditure of time in the clinical routine and/or in disturbance to the daily planning in a radiological practice.

For this purpose, modern magnetic resonance devices include methods for movement correction e.g. navigator recordings, field probes and/or an optical camera. With these methods the patient movement is traced, for example, and the coordinate system of the recording method, for example of the gradient circuit, is adjusted accordingly in real time.

This results in restrictions. The maximum correctable movement is restricted since excessively large adaptations of the coordinate system may result in increased nerve stimulations. The result would be an interruption in the measuring sequence if the statutory limit values are exceeded.

SUMMARY

The scope of the present invention is defined solely by the appended claims and is not affected to any degree by the statements within this summary. The present embodiments may obviate one or more of the drawbacks or limitations in the related art.

Embodiments provide a method for performing a measuring sequence by a magnetic resonance device for examining a patient. The performance of the measuring sequence includes a processing of segments, for example a series of segments in sequence. If at least one determined patient load value exceeds a predetermined limit value, the processing of the measuring sequence is interrupted for the time frame of exceeding the patient load value. The determination of the at least one patient load value includes a detection of a movement of a patient into a changed pose, an adjustment of at least one, for example temporally subsequent segment to the changed pose of the patient and a determination of at least one patient load value for the adjusted at least one, for example temporally subsequent segment.

The method may provide the advantage, for example, of avoiding the patient load value being exceeded and, for example, immediate interruptions in the measuring sequence that are triggered as a result.

The measuring sequence may be provided by a data carrier for its performance, for example, and loaded into a computer unit. For example, an operator of the magnetic resonance device may produce and/or select the measuring sequence. A measuring sequence may be a spin echo sequence and/or a gradient echo sequence, for example. The measuring sequence may include a series of several segments. For example, the measuring sequence defines the order in which the number of segments in a sequence are to be performed.

A segment may include the irradiation of one or more RF pulses into the patient and/or the switching of one of more gradients. In other words, a segment may include the playing out of one or more RF pulses and/or gradient pulses. For example, a segment may acquire a part, for example a point, a line and/or a spiral, of a k-space by the magnetic resonance device. The processing of the segments in a sequence may be for example a successive performance of for example temporally subsequent segments in a sequence.

The exceedance of the predetermined limit value by the at least one determined patient load value may be understood to refer to an interruption condition for the interruption of the processing of the measuring sequence. The at least one determined patient load value may exceed the predetermined limit value, by, with an adjustment of a subsequent segment to be performed to the changed pose of the patient, the patient load occurring as a result being too large. When the interruption condition occurs, this following segment and any subsequent segments in the sequence are initially not performed. The processing of the following segments is continued as soon as the interruption condition is no longer fulfilled. The interruption condition may no longer be fulfilled, for example, if the patient moves back into the pose that the patient assumed before the interruption.

The limit value for the patient load value may be provided by a data carrier, for example, and loaded into a computer unit. An operator of the magnetic resonance device may enter the limit value for the patient load value, for example. The limit value for the patient load value may be predetermined for example by legal standards.

The movement of the patient may be detected, for example, by navigator recordings, field probes and/or an, for example optical, camera. The movement of the patient may include for example a movement of a body part, e.g. the head, of the patient.

The pose of a patient may include a point, for example a spatial position, and/or a location, for example a spatial orientation, of at least one part of the patient. By moving the patient, at least one part of the patient may extend from one pose before the movement into a changed pose after the movement.

The adjustment of the at least one following segment to the changed pose of the patient may include a determination of at least one adjusted subsequent segment, that prospectively at least partially corrects the movement of the patient. For example, a corresponding rotation of the coordinate system of the gradient circuit may result from a rotation of the patient, that in the adjusted subsequent segment is mirrored in correspondingly changed gradient pulses. If a body part of the patient to be recorded rotates about an angle α, for example, then the gradient field generated by the gradients is also rotated about the angle α.

A further embodiment of the method provides that the at least one patient load value includes a specific absorption rate (SAR) and/or a nerve stimulation, for example a peripheral nerve stimulation (PNS).

The SAR may be a measure of an energy input into the patient through the irradiated RF pulse.

For example, gradient pulses and thus temporally changeable magnetic fields may have an impact on the human body. If the electric fields generated exceed a specific threshold value, electrical currents may be induced in the body of the patient and stimulate nerves or muscles. The stimulation may be perceived to be unpleasant by the patient. An adjustment of the gradient pulses for movement correction may influence the nerve stimulation. The proposed method allows the permissible nerve stimulation to be exceeded and for example immediate interruptions in the measuring sequence that are triggered as a result to be avoided.

A further embodiment provides that the determination of the at least one patient load value is performed continuously while the measuring sequence is being performed. For example, the determination of the at least one patient load value is performed continuously and/or constantly and/or in real time while the measuring sequence is being performed.

Advantageously as a result the interruption condition may be checked continuously, so that on the one hand the performance of a measuring sequence may be interrupted promptly, for example before the predetermined limit value for the patient load value is exceeded, and on the other hand may be continued as quickly as possible.

A further embodiment provides that RF pulses are irradiated and/or gradients are switched (also) during the interruption in the processing of the measuring sequence. The RF pulses irradiated and/or gradients switched during the interruption in the processing of the measuring sequence are irradiated and/or switched in the same way as in the segment preceding the interruption. For example, during the interruption the RF pulses and/or gradient pulses have the same shape and/or amplitude and/or length as in the segment preceding the interruption.

As a result, it is advantageously possible to retain the steady state of the signal. As a result, oscillation processes that could result in signal fluctuations and thus in artifacts may possibly be avoided. The image quality may thus be increased.

A further embodiment provides that no magnetic resonance signals are acquired during the interruption of the processing of the measuring sequence. For example, the recording of unnecessary data may be avoided as a result.

A further embodiment provides that a signal is output to an operator and/or the patient if the interruption exceeds a predetermined signal duration e.g. 10 seconds.

A command may be given to the operator and/or the patient by the signal, for example. For example, the patient may be requested by the signal to move back into his starting pose before the interruption.

The signal is an optical and/or acoustic signal, since such signals may be suited to communication with the operator and/or the patient.

A further embodiment provides that the processing of the measuring sequence is canceled if the interruption exceeds a predetermined interruption duration e.g. 1 minute.

The interruption takes place with an indication to the operator that the measuring sequence has to be performed again.

Furthermore, a magnetic resonance device is proposed that is configured to carry out a previously described method. For example, the magnetic resonance device includes a system control unit for carrying out the method steps.

The advantages of the magnetic resonance device substantially correspond to the advantages of the method for performing a measuring sequence by a magnetic resonance device, that are configured in detail above. Features, advantages, or alternative embodiments mentioned here may likewise also be transferred to the other claimed subject matters and vice versa.

Furthermore, a computer program product is proposed, that includes a program and may be loaded directly into a memory of a programmable system control unit of a magnetic resonance device and includes program code, e.g. libraries and auxiliary functions, for executing a previously described method for performing a measuring sequence by a magnetic resonance device, if the computer program product is executed in the system control unit of the magnetic resonance device. The computer program product may include an item of software with a source code that must still be compiled and linked or that must only be interpreted, or an executable software code that, for execution, must only be loaded into the system control unit. By the computer program product, the method for performing a measuring sequence may be performed rapidly, exactly reproducibly and robustly. The computer program product is configured so that it may execute the method steps by the system control unit. The system control unit must have the pre-conditions in each case such as, for example, a suitable working memory, a suitable graphics card or a suitable logic unit so that the respective method steps may be performed efficiently.

The computer program product is stored, for example, on a computer-readable medium or is deposited on a network or server from where it may be loaded into the processor of a local system control unit that may be directly connected to the magnetic resonance device or configured as part of the magnetic resonance device. Furthermore, control information of the computer program product may be stored on an electronically readable data carrier. The control information of the electronically readable data carrier may be configured so that it performs a method for performing a measuring sequence when the data carrier is used in a system control unit of a magnetic resonance device. Examples of electronically readable data carriers are a DVD, a magnetic tape, or a USB stick, on which is stored electronically readable control information, for example software. If this control information is read from the data carrier and stored in a system control unit of the magnetic resonance device, all the embodiments of the above-described method may be performed. Embodiments may therefore also proceed from the aforementioned computer-readable medium and/or the aforementioned electronically readable data carrier.

DETAILED DESCRIPTION

Figure 1:
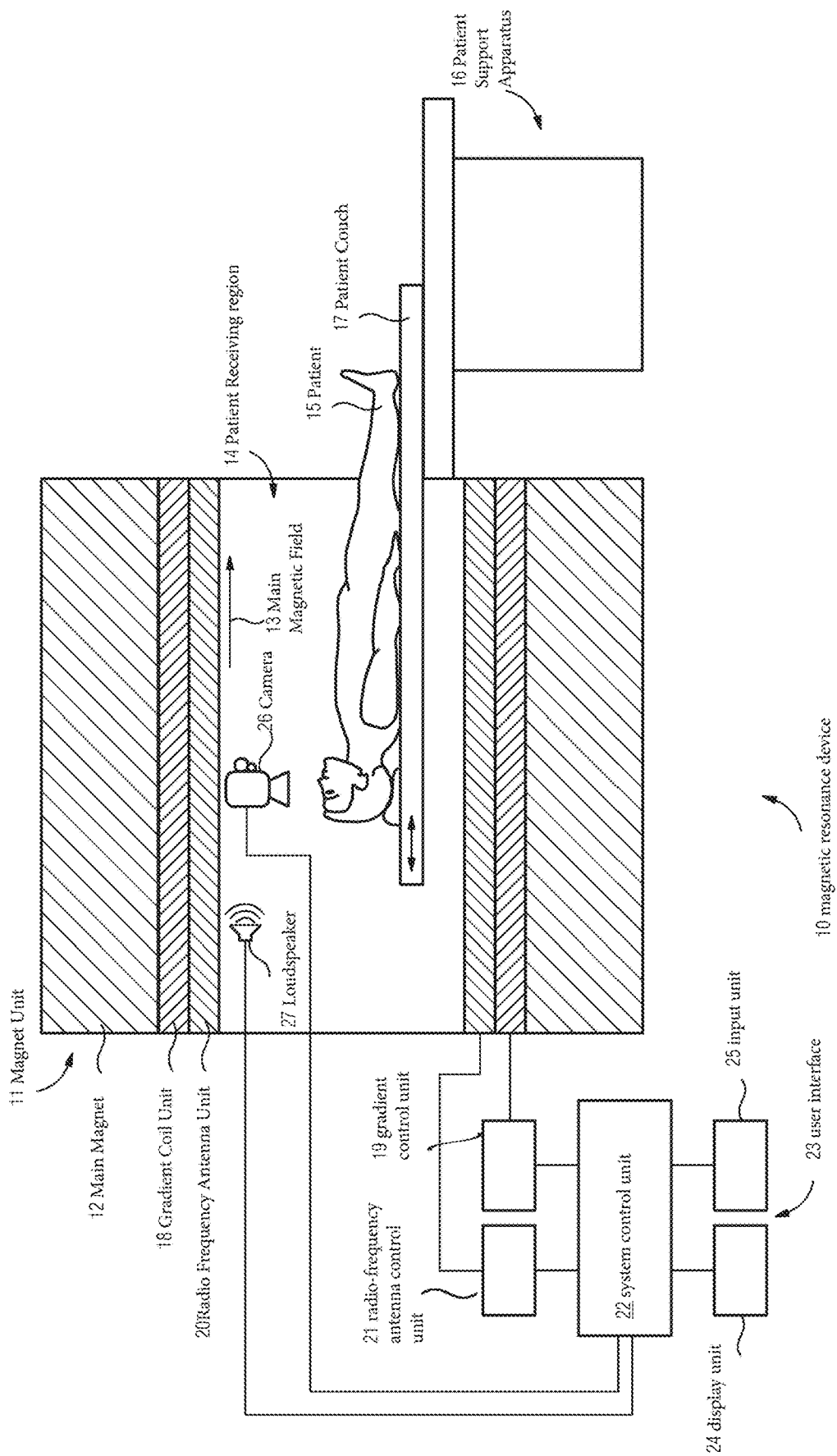
FIG. 1 depicts a proposed magnetic resonance device in a schematic representation according to an embodiment.

FIG. 1 depicts a schematic representation of a magnetic resonance device 10. The magnetic resonance device 10 includes a magnet unit 11, that includes a main magnet 12 for generating a strong and for example temporally constant main magnetic field 13. The magnetic resonance device 10 includes a patient receiving region 14 for receiving a patient 15. In an embodiment, the patient receiving region 14 is configured to be cylindrical and is surrounded in a cylindrical manner in a peripheral direction by the magnet unit 11. The patient receiving region 14 may include a different configuration. The patient 15 may be moved into the patient receiving region 14 by a patient support apparatus 16 of the magnetic resonance device 10. The patient support apparatus 16 includes a patient couch 17 configured movably within the patient receiving region 14.

The magnet unit 11 also includes a gradient coil unit 18 for generating magnetic field gradients that are used during an imaging for a spatial encoding. One or more gradient coils (not shown here) of the gradient coil unit 18 switch gradients or generate gradient pulses. The gradient coil unit 18 is controlled by a gradient control unit 19 of the magnetic resonance device 10. The magnet unit 11 further includes a radio-frequency antenna unit 20, that is configured as a body coil that is fixedly integrated into the magnetic resonance apparatus 10. The radio-frequency antenna unit 20 generates RF pulses and radiates these for exciting atomic nuclei, that takes place in the main magnetic field 13 generated by the main magnet 12, into the patient receiving region 14 or the patient 15. The radio-frequency antenna unit 20 is controlled by a radio-frequency antenna control unit 21 of the magnetic resonance device 10. The radio-frequency antenna unit 20 is further configured to receive magnetic resonance signals.

In order to control the main magnet 12, the gradient control unit 19 and to control the radio-frequency antenna control unit 21, the magnetic resonance device 10 includes a system control unit 22. The system control unit 22 centrally controls the magnetic resonance device 10, such as for example the performance of a measuring sequence for examining the patient 15. Furthermore, the magnetic resonance device 10 includes an apparatus for detecting the movement of the patient 15, such as, for example, a camera 26. The camera sends received movement detection signals, e.g. image signals, to the system control unit 22. Further apparatuses, e.g. field probes, and/or methods, e.g. navigator measurements, are however known to the person skilled in the art for detecting the patient movement. Moreover, the magnetic resonance device 10 includes a loudspeaker 27 for generating an acoustic signal. The loudspeaker 27 may be controlled by the system control unit 22. The magnetic resonance device 10 may include other apparatuses for transmitting acoustic and/or optical signals to the patient 15.

The system control unit 22 includes an evaluation unit (not shown in more detail) for evaluating magnetic resonance signals, that are detected during the magnetic resonance examination. The magnetic resonance device 10 includes a user interface 23, that is connected to the system control unit 22. Control information, such as, for example, imaging parameters and reconstructed magnetic resonance images may be displayed on a display unit 24, for example on at least one monitor, of the user interface 23 for a medical operator. The user interface 23 includes an input unit 25, by which information and/or parameters may be entered by the medical operator during a measuring process. It is also possible to load a program of a computer program product into the system control unit 22 in order to execute the method steps shown in FIG. 2.

Figure 2:
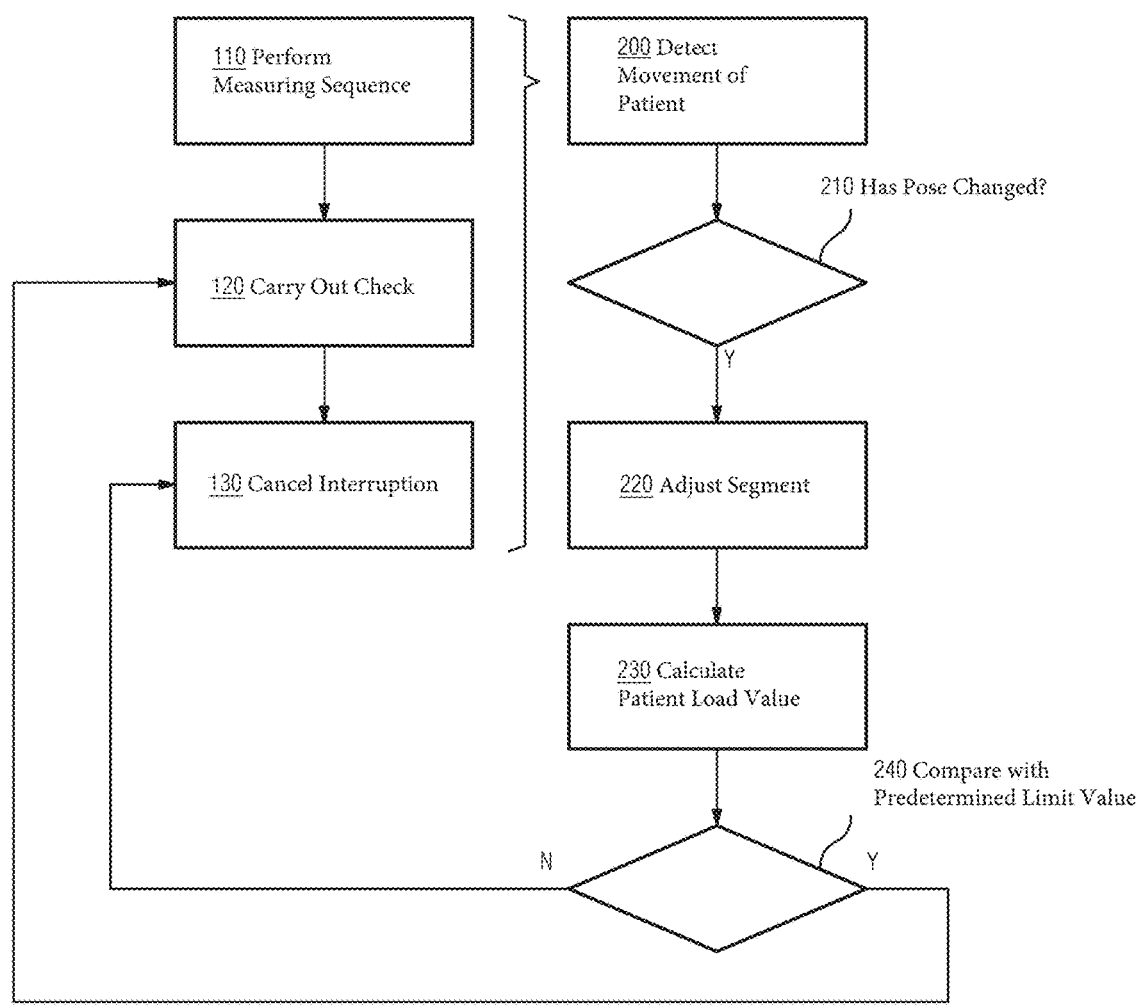
FIG. 2 depicts a block diagram of a method for performing a measuring sequence by the magnetic resonance device according to an embodiment.

In FIG. 2 a method for performing a measuring sequence by a magnetic resonance device 10 is depicted. In 110 a measuring sequence is performed by processing segments. During the entire magnetic resonance measurement, in other words during the performance of the measuring sequence in 110 and also in the following steps 120 and 130, the patient is detected in 200. The subsequent steps 210 and possibly also 220, 230 and 240 are also performed continuously in parallel with performing the measuring sequence or processing the segments so that the steps are possibly repeated time and again.

A check is carried out in 210 to determine whether the patient moves into a changed pose. For example, a check is carried out to determine whether the point and location of at least one part of the patient 15, e.g. of the head, changes. If this is the case, at least one subsequent segment is adjusted in 220 to the changed pose of the patient. The adjustment may take place for example by changing the RF pulses generated by the radio frequency antenna unit 20, and/or gradient pulses generated by the gradient coil unit 18.

At least one patient load value is determined in 230 for the adjusted at least one following segment. The patient load value may include, for example, a specific absorption rate and/or a nerve stimulation of the patient 15. A check is carried out in 240 to determine whether the determined patient load value exceeds a predetermined limit value. If this is the case, the processing of the measuring sequence is tern in 120. The interruption is only canceled again in 130 if it is determined in a subsequent check in 240 that the predetermined limit value is no longer exceeded. The processing of the measuring sequence is therefore interrupted for as long as the at least one determined patient load value exceeds a predetermined limit value.

Figure 3:
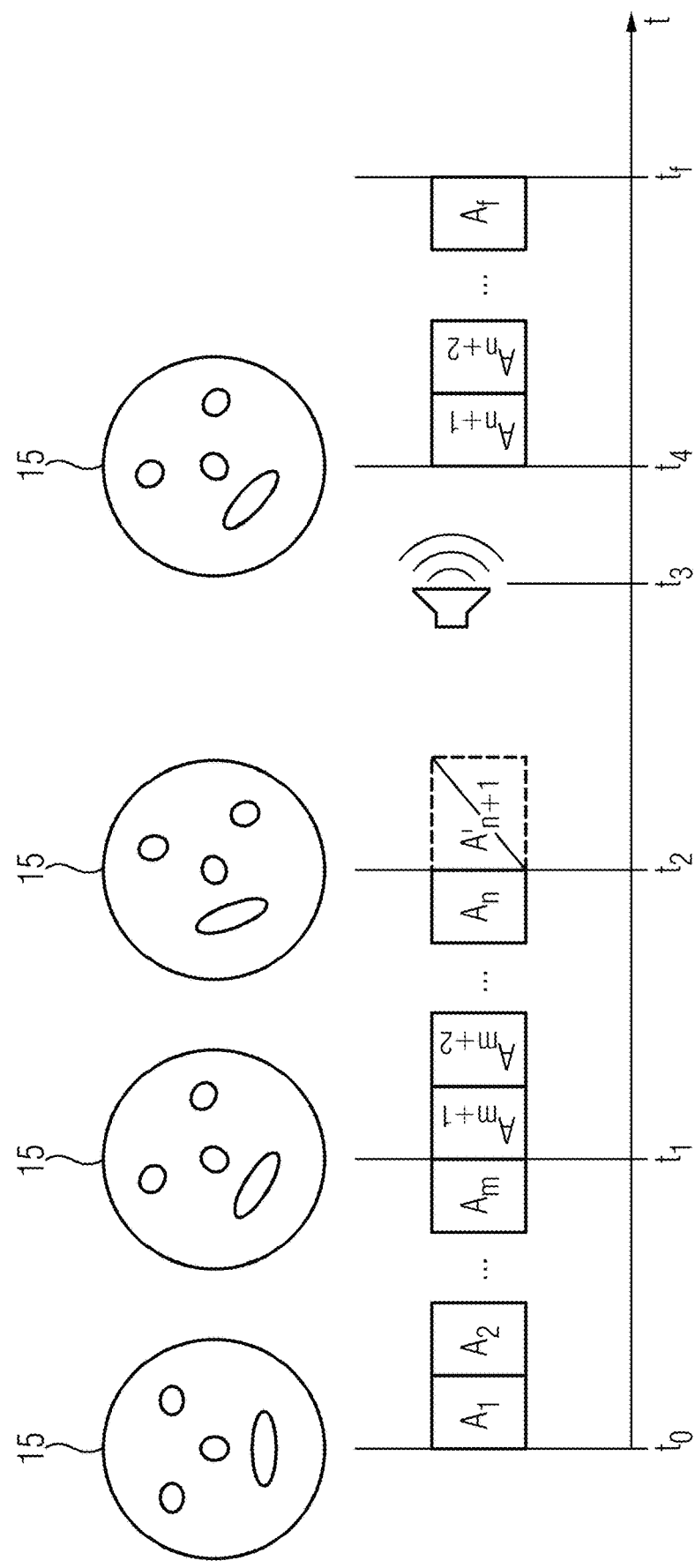
FIG. 3 depicts an illustration of a performance of a measuring sequence according to an embodiment of the proposed method.

By way of example FIG. 3 illustrates in detail the course over time t of the proposed method. A measuring sequence is performed here, that includes segments $A_1, A_2, \ldots A_f$. The performance of the measuring sequence starts at time instant $t_0$. At this time instant the patient 15 is located in a starting pose. Segments $A_1, A_2, \ldots A_m$ are firstly processed according to 110 up until time instant $t_1$.

During the entire measuring time from $t_0$ to $t_f$, the movement of the patient is detected in 200, e.g. by the camera 26, and in 210 a check is carried out to determine whether the patient 15 is moving into a changed pose. At time instant $t_1$ it is determined in 210 that the pose of the patient 15 has changed. In the example shown, the patient 15 has rotated his head. In 220, the segment $A_{m+1}$ following $A_m$ or $t_1$ is then adjusted to the changed pose of the patient 15. Such an adjustment may also be referred to as a prospective movement correction. It is then determined in 230 by calculating a patient load value which patient load would cause an application of the adjusted segment $A_{m+1}$. The calculated patient load value is compared in 240 with a predetermined limit value. If this comparison shows that the predetermined limit value is not exceeded, then the adjusted segment $A_{m+1}$ is applied and the processing of the remaining segments $A_{m+2}, \ldots A_f$ initially continues without a further delay.

At time instant t2, a further adjustment of a segment is performed in a repeated cycle of steps 200, 210, 220, since the head of the patient 15 has rotated further. For the segment $A'_{n+1}$ adjusted as a result, a patient load value is determined in 230, for which it results however in 240 that this exceeds the predetermined limit value. The segment $A'_{n+1}$ is therefore not applied, that is expressed in FIG. 3 by a crossing out. Instead, the processing of the segments is interrupted in 120.

According to conventional measuring methods, the entire measuring sequence would be canceled at this point, with the result that the entire measurement would have to be repeated from the start.

According to the proposed method, the further processing of the segments is left until at time instant $t_4$ the patient 15 has moved back into a pose for which in 220 an adjusted segment $A_{n+1}$ is determined, for which in 240 the exceedance of the permissible patient load value is not determined. Then in 130 the processing of the remaining segments $A_{n+1}, \ldots A_f$ is continued. The entire measuring sequence may therefore be continued to the end without resulting in an interruption.

In the period of time of the interruption between $t_2$ and $t_4$, RF pulses are also irradiated and/or gradients are switched. For example, these RF pulses and/or are the same ones that were also averted in the segment $A_n$ directly preceding the interruption. The orientation settings of the preceding data are advantageously used further and their gradients are played out in order to maintain a steady state of the signal. However, no acquisition of magnetic resonance data is performed, but only RF pulses and gradients are played out. It may for example be advantageous e.g. in a TSE echo train (TSE: Turbo Spin Echo) to only play out the excitation pulse in order to maintain a steady state and to omit refocusing pulses in order to reduce the SAR load of the patient 15.

At the time instant $t_3$ a command may be given to the operator and/or directly to the patient after a predetermined, for example user-defined, period of time (e.g. 10 seconds) from the time instant $t_2$ of the start of the interruption. This may be an acoustic signal, for example, that is output with the loudspeaker 27. On account of the command the patient 15 may be instructed to move his head back into the starting position.

The measurement may optionally also be interrupted after a predetermined waiting time of e.g. 1 minute (not shown here). A notification is then output to the operator e.g. on the display unit 24, such that the measurement is to be repeated.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for performing a measuring sequence by a magnetic resonance device, the method comprising:

performing the measuring sequence, the measure sequence comprising a sequence of segments; and interrupting performance of the measuring sequence for as long as at least one determined patient load value exceeds a predetermined limit value;

wherein the determination of the at least one patient load value comprises:

detecting a movement of a patient into a changed pose, adjusting at least one following segment in the sequence of segments to the changed pose of the patient, determining at least one patient load value for the adjusted at least one following segment in the sequence of segments.

2. The method of claim 1, wherein the at least one patient load value relates to a specific absorption rate, a nerve stimulation, or a specific absorption rate and a nerve stimulation.

3. The method of claim 1, wherein the determination of the at least one patient load value is performed continuously during the performance of the measuring sequence.

4. The method of claim 1, wherein during the interruption in the processing of the measuring sequence, RF pulses are irradiated, gradients are switched, or RF pulses are irradiated and gradients are switched.

5. The method of claim 4, wherein the RF pulses irradiated or the gradients switched during the interruption in the processing of the measuring sequence are irradiated or switched in the same way as in the segment in the sequence of segments preceding the interruption.

6. The method of claim 1, wherein no magnetic resonance signals are acquired during the interruption in the performance of the measuring sequence.

7. The method of claim 1, further comprising:

outputting a signal to an operator, to the patient, or to the operator and the patient when the interruption exceeds a predetermined signal duration.

8. The method of claim 7, wherein the signal comprises an optical signal or an acoustic signal.

9. The method of claim 1, wherein the performance of the measuring sequence is terminated if the interruption exceeds a predetermined interruption time frame.

10. A non-transitory computer implemented storage medium that stores machine-readable instructions executable by at least one processor for performing a measuring sequence by a magnetic resonance device, the machine-readable instructions comprising:

performing the measuring sequence, the measuring sequence comprising a sequence of segments; and interrupting performance of the measuring sequence for as long as at least one determined patient load value exceeds a predetermined limit value;

wherein the determination of the at least one patient load value comprises:

detecting a movement of a patient into a changed pose, adjusting at least one subsequent segment in the sequence of segments to the changed pose of the patient, determining at least one patient load value for the adjusted at least one subsequent segment in the sequence of segments to.

11. The non-transitory computer implemented storage medium of claim 10, wherein the at least one patient load value relates to a specific absorption rate and/or a nerve stimulation.

12. The non-transitory computer implemented storage medium of claim 10, wherein the determination of the at least one patient load value is performed continuously during the performance of the measuring sequence.

13. The non-transitory computer implemented storage medium of claim 10, wherein during the interruption in the processing of the measuring sequence, RF pulses are irradiated, gradients are switched, or RF pulses are irradiated and gradients are switched.

14. The non-transitory computer implemented storage medium of claim 13, wherein the RF pulses irradiated or the gradients switched during the interruption in the performance of the measuring sequence are irradiated or switched in the same way as in a segment of the sequence of segments that precedes the interruption.

15. The non-transitory computer implemented storage medium of claim 10, wherein no magnetic resonance signals are acquired during the interruption in the performance of the measuring sequence.

16. The non-transitory computer implemented storage medium of claim 10, wherein the machine-readable instructions further comprise:
   outputting a signal to an operator, to the patient, or to the operator and the patient when the interruption exceeds a predetermined signal duration.

17. The non-transitory computer implemented storage medium of claim 16, wherein the signal comprises an optical signal or an acoustic signal.

18. The non-transitory computer implemented storage medium of claim 10, wherein the processing of the measuring sequence is terminated if the interruption exceeds a predetermined interruption time frame.

* * * * *